(12) United States Patent
Otani et al.

(10) Patent No.: US 10,079,965 B2
(45) Date of Patent: Sep. 18, 2018

(54) IMAGING APPARATUS AND MANUFACTURING METHOD OF IMAGING APPARATUS, AND ELECTRONIC EQUIPMENT AND MANUFACTURING METHOD OF ELECTRONIC EQUIPMENT

(71) Applicant: SONY CORPORATION, Tokyo (JP)

(72) Inventors: Hidetsugu Otani, Kumamoto (JP); Yuuji Kishigami, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/035,827

(22) PCT Filed: Nov. 27, 2014

(86) PCT No.: PCT/JP2014/081330
§ 371 (c)(1),
(2) Date: May 11, 2016

(87) PCT Pub. No.: WO2015/087704
PCT Pub. Date: Jun. 18, 2015

(65) Prior Publication Data
US 2016/0295080 A1    Oct. 6, 2016

(30) Foreign Application Priority Data

Dec. 10, 2013 (JP) .................................. 2013-254729

(51) Int. Cl.
*H04N 5/225* (2006.01)
*G02B 7/02* (2006.01)
(Continued)

(52) U.S. Cl.
CPC ............. *H04N 5/2254* (2013.01); *G02B 7/02* (2013.01); *H01L 27/14618* (2013.01);
(Continued)

(58) Field of Classification Search
CPC .. H04N 5/2252; H04N 5/2253; H04N 5/2254; G06K 9/209; G02B 7/02
(Continued)

(56) References Cited

U.S. PATENT DOCUMENTS

2008/0278617 A1* 11/2008 Tanida ................ H04N 5/2254
348/340
2008/0316344 A1* 12/2008 Yamamiya ............... G02B 7/09
348/294

(Continued)

FOREIGN PATENT DOCUMENTS

JP    2003-51973 A    2/2003
JP    2006-135439 A   5/2006
(Continued)

OTHER PUBLICATIONS

International Search Report received for PCT Application No. PCT/JP2014/081330, dated Mar. 3, 2015, 2 pages.
(Continued)

*Primary Examiner* — Kelly L Jerabek
(74) *Attorney, Agent, or Firm* — Chip Law Group

(57) ABSTRACT

The present technology relates to an imaging apparatus and a manufacturing method of the imaging apparatus. A glass plate 13 is mounted at a position corresponding to an opening portion 15 *a* on a substrate 15. An imaging device 16 is mounted at a position with an optically appropriate distance in terms of design based on a surface of the glass plate 13 on a face of the substrate 15 opposite to a face on which the glass plate 13 is mounted, at a position corresponding to the opening portion 15 *a*. A lens barrel portion 11 is placed so that the optical system block 12 is set at a position with an optically appropriate distance on the glass plate 13, and fixed with an adhesive 14.

10 Claims, 3 Drawing Sheets

(51) Int. Cl.
*H01L 27/146* (2006.01)
*H04N 5/374* (2011.01)

(52) U.S. Cl.
CPC ......... *H04N 5/2253* (2013.01); *H04N 5/2257* (2013.01); *H04N 5/374* (2013.01)

(58) Field of Classification Search
USPC .......................................................... 348/340
See application file for complete search history.

(56) References Cited

U.S. PATENT DOCUMENTS

| | | | | |
|---|---|---|---|---|
| 2010/0085465 A1* | 4/2010 | Shiung | ................... | G03B 17/00 348/340 |
| 2010/0110270 A1* | 5/2010 | Sekimoto | ............. | H04N 5/2254 348/340 |
| 2010/0141825 A1* | 6/2010 | Kim | ................. | H01L 27/14618 348/340 |
| 2011/0085070 A1* | 4/2011 | Kang | ............... | B29D 11/00432 348/340 |
| 2012/0242883 A1* | 9/2012 | Pavithran | ............. | H04N 5/2257 348/340 |
| 2015/0358510 A1* | 12/2015 | Wan | ..................... | H04N 5/2254 348/340 |

FOREIGN PATENT DOCUMENTS

| | | |
|---|---|---|
| JP | 2006-222473 A | 8/2006 |
| WO | 2007/043509 A | 4/2007 |

OTHER PUBLICATIONS

Written Opinion received for PCT Application No. PCT/JP2014/081330, dated Mar. 3, 2015, 4 pages.
International Preliminary Report received for PCT Application No. PCT/JP2014/081330, dated Jun. 14, 2016, 4 pages.

* cited by examiner

IMAGING APPARATUS AND MANUFACTURING METHOD OF IMAGING APPARATUS, AND ELECTRONIC EQUIPMENT AND MANUFACTURING METHOD OF ELECTRONIC EQUIPMENT

CROSS REFERENCE TO RELATED APPLICATIONS

This application is a U.S. National Phase of International Patent Application No. PCT/JP2014/081330 filed on Nov. 27, 2014, which claims priority benefit of Japanese Patent Application No. JP 2013-254729 filed in the Japan Patent Office on Dec. 10, 2013. Each of the above-referenced applications is hereby incorporated herein by reference in its entirety.

TECHNICAL FIELD

The present technology relates to an imaging apparatus and a manufacturing method of the imaging apparatus, and electronic equipment and a manufacturing method of the electronic equipment, and, more particularly, to an imaging apparatus and a manufacturing method of the imaging apparatus, and electronic equipment and a manufacturing method of the electronic equipment which enable improvement of optical characteristics.

BACKGROUND ART

A technique has been proposed which improves optical characteristics upon assembly of a substrate on which an imaging device typified by a charge coupled device (CCD) and a complementary metal oxide semiconductor (CMOS) is assembled, and an optical system block constituted with a lens, or the like.

For example, a technique has been proposed which improves optical characteristics by preventing unnecessary light from being incident on an imaging device by applying an opaque resin to an inner face of a through-hole which transmits incident light to the imaging device, so as not to allow unnecessary light to be incident on the imaging device even when a material with high translucency is utilized (see Patent Literature 1).

CITATION LIST

Patent Literature

Patent Literature 1: Patent Application No. 2003-101002

SUMMARY OF INVENTION

Technical Problem

However, with the above-described technique, because a lens and an imaging device are assembled based on a lens barrel portion, there is no guarantee that the lens and the imaging device are assembled to have appropriate positional relationship, and there is a possibility that high optical characteristics cannot be obtained.

That is, when the lens and the imaging device are assembled based on the lens barrel portion, because the lens and the imaging device are assembled based on a marker, or the like, provided in advance at the lens barrel portion, and not assembled while optical positional relationship is confirmed, there is a possibility that high optical characteristics cannot be obtained.

The present technology has been made in view of such circumstances, and is particularly intended to obtain high optical characteristics by performing assembly while confirming optical positions based on a glass plate through which optical positional relationship is clear.

Solution to Problem

According to one aspect of the present technology, there is provided an imaging apparatus including: an optical system block configured to focus incident light at a predetermined focus point; a glass plate configured to transmit incident light incident through the optical system block; and an imaging device configured to generate a pixel signal through photoelectric conversion with the incident light focused by the optical system block through the glass plate. The optical system block and the imaging device are assembled at positions based on a predetermined position of the glass plate.

The predetermined position can be a position on a surface of the glass plate.

The optical system block can be assembled on the glass plate.

A frame on which the glass plate is mounted can be further included on a substrate on which the imaging device is assembled. The imaging device can be assembled at the position based on the surface position of the glass plate in a state where the imaging device is assembled on the substrate.

According to one aspect of the present technology, there is provided electronic equipment in an imaging apparatus including: an optical system block configured to focus incident light at a predetermined focus point; a glass plate configured to transmit incident light incident through the optical system block; and an imaging device configured to generate a pixel signal through photoelectric conversion with the incident light focused by the optical system block through the glass plate. The optical system block and the imaging device are assembled at positions based on a predetermined position of the glass plate.

According to one aspect of the present technology, there is provided a manufacturing method of an imaging apparatus including an optical system block configured to focus incident light at a predetermined focus point, a glass plate configured to transmit incident light incident through the optical system block, and an imaging device configured to generate a pixel signal through photoelectric conversion with the incident light focused by the optical system block through the glass plate, the manufacturing method including: a first step of assembling the glass plate; a second step of assembling the imaging device at a position based on a predetermined position of the glass plate; and a third step of assembling an optical system block at a position based on the predetermined position of the glass plate.

The predetermined position can be a position on a surface of the glass plate.

In the third step, the optical system block can be assembled at the position based on the predetermined position of the glass plate on the glass plate.

The imaging apparatus can further include a frame on which the glass plate is mounted on a substrate on which the imaging device is assembled. In the second step, the imaging device can be assembled at the position based on the predetermined position of the glass plate in a state where the imaging device is assembled on the substrate.

According to one aspect of the present technology, there is provided a manufacturing method of electronic equipment including an optical system block configured to focus incident light at a predetermined focus point, a glass plate configured to transmit incident light incident through the optical system block, and an imaging device configured to generate a pixel signal through photoelectric conversion with the incident light focused by the optical system block through the glass plate, the manufacturing method including: a first step of assembling the glass plate; a second step of assembling the imaging device at a position based on a predetermined position of the glass plate; and a third step of assembling an optical system block at a position based on the predetermined position of the glass plate.

According to one aspect of the present technology, incident light is focused at a predetermined focus point by an optical system block, the incident light incident via the optical system block is transmissive through a glass plate, a pixel signal is generated by the incident light focused by the optical system block via the glass plate being subjected to photoelectric conversion by the imaging device, and the optical system block and the imaging device are assembled at positions based on a predetermined position of the glass plate.

Advantageous Effects of Invention

According to one aspect of the present technology, it is possible to obtain high-precision optical characteristics.

DESCRIPTION OF EMBODIMENTS

Embodiments for implementing the present technology (hereinafter, referred to as embodiments) will be described below. It should be noted that description will be provided in the following order.
1. First Embodiment (Example Where Optical system block is Assembled on Glass Surface)
2. Second Embodiment (Example Where Optical system block is Assembled on Frame)
<<1. First Embodiment>>
<First Configuration Example of Imaging Apparatus>

Figure 1:
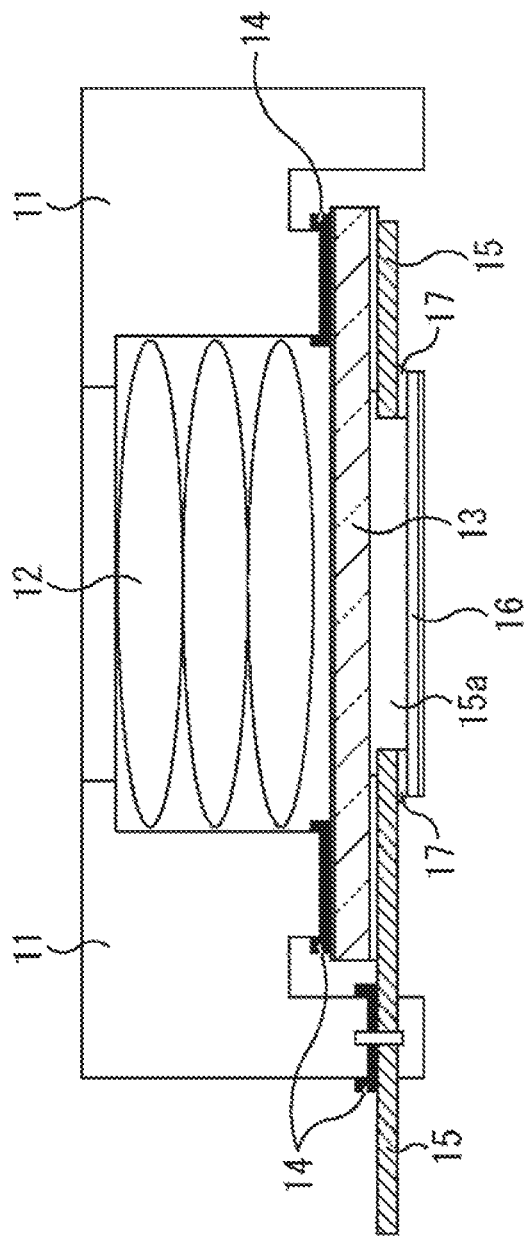
FIG. 1 is a diagram explaining a configuration of a first embodiment of an imaging apparatus to which the present technology is applied.

FIG. 1 is a diagram illustrating a configuration example of a first embodiment of an imaging apparatus to which the present technology is applied.

FIG. 1 illustrates a side face cross-sectional diagram near an imaging device and an optical system block, of the imaging apparatus, in which incident light is incident from above to below in the drawing.

In FIG. 1, an opening portion 15a is provided at a substrate 15, and an imaging device 16 is connected via a chip wiring 17 at a position corresponding to the opening portion 15a on a lower face of the substrate 15 in the drawing. Meanwhile, a glass plate 13 is provided on an upper face of the substrate 15.

Further, on the glass plate 13, a lens barrel portion 11 which includes an optical system block 12 having optical characteristics for both focusing and focus adjustment or either focusing or focus adjustment is provided, and fixed with an adhesive 14 applied on the substrate 15 and the glass plate 13.

According to a configuration as illustrated in FIG. 1, by incident light incident from above in the drawing being transmissive through the optical system block 12, the incident light is adjusted so as to be focused on the imaging device 16, transmissive through the glass pate 13 and incident on the imaging device 16. The imaging device 16, which is a solid state imaging device typified by a complementary metal-oxide semiconductor (CMOS), outputs an image signal constituted with a pixel signal generated through photoelectric conversion with the incident light incident in this manner.
<Manufacturing Processing of Imaging Apparatus in FIG. 1>

Figure 2:
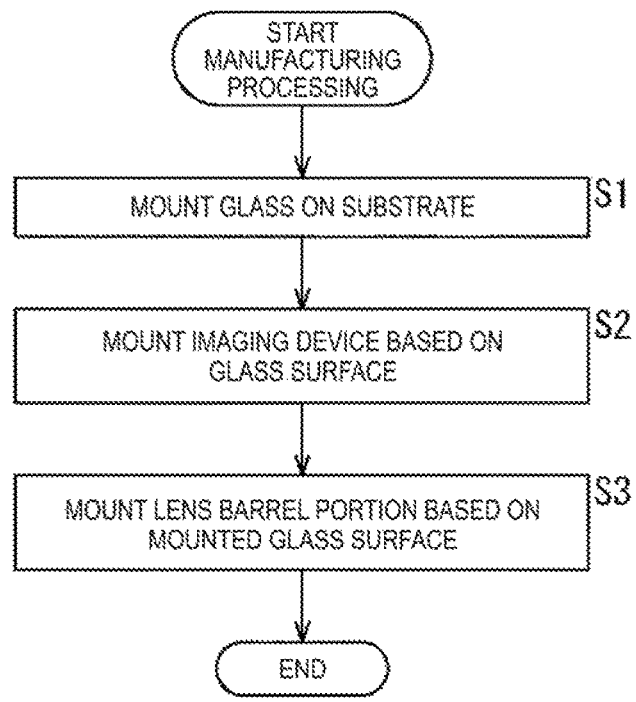
FIG. 2 is a flowchart explaining manufacturing processing of an imaging device in FIG. 1.

Manufacturing processing of the imaging apparatus in FIG. 1 will be described next with reference to the flowchart of FIG. 2.

In step S1, the glass plate 13 is mounted at a position corresponding to the opening portion 15a on the substrate 15.

In step S2, the imaging device 16 is mounted at a position with an optically appropriate distance in terms of design based on a surface of the glass plate 13 (or a predetermined reference plane), on a face of the substrate 15 opposite to a face on which the glass plate 13 is mounted, at a position corresponding to the opening portion 15a.

In step S3, the lens barrel portion 11 is placed so that the optical system block 12 is set at a position with an optically appropriate distance in terms of design based on a surface of the glass plate 13 (or a predetermined reference plane) on the glass plate 13, and is fixed with an adhesive 14.

Through the above processing, because the optical system block 12 and the imaging device 16 can be provided at a position with an optically appropriate distance in terms of design from the surface of the glass plate 13 (or the predetermined reference plane), it is possible to obtain high optical characteristics.

Further, because the optical system block 12 and the imaging device 16 are assembled based on a distance from the surface of the glass plate 13 or the predetermined reference plane, it is possible to make the substrate 15 thinner, which results in making it possible to make the whole imaging apparatus thinner and to save a material of the substrate 15.

Further, because the lens barrel portion 11 and the imaging device 16 are assembled while it is confirmed that distances are optically appropriate based on the surface of the glass plate 13 (or the predetermined reference plane), it is possible to omit subsequent optical confirmation, or the like, which makes it possible to omit workload in the manufacturing process.
21 <2. Second Embodiment>>
<Second Configuration Example of Imaging Apparatus>

While, in the above description, an example where the lens barrel portion 11 including the optical system block 12 is mounted on the glass plate 13 has been described, the lens barrel portion 11 may be mounted on the frame provided on the substrate 15.

Figure 3:
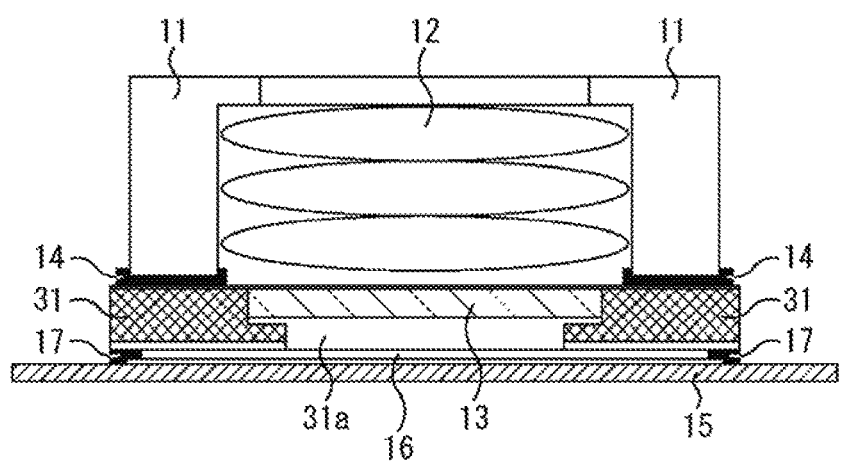
FIG. 3 is a diagram explaining a configuration of a second embodiment of an imaging apparatus to which the present technology is applied.

FIG. 3 is a diagram illustrating a configuration example of a second embodiment of the imaging apparatus in which the lens barrel portion 11 including the optical system block 12 is mounted on the frame provided on the substrate 15. It should be noted that the same reference numerals and names are assigned to components in FIG. 3 having the same functions as those of the imaging apparatus in FIG. 1, and explanation thereof will be omitted as appropriate.

That is, the imaging apparatus in FIG. 3 is different from the imaging apparatus in FIG. 1 in that the imaging device 16 is provided on the substrate 15, an opening portion 31a is provided near a central portion which becomes an effective pixel region of the imaging device 16, and that the lens barrel portion 11 is mounted on the frame 31 which is newly provided on the imaging device 16.

In the imaging apparatus in FIG. 3, the opening portion 15a is not provided at the substrate 15, and, instead, the imaging device 16 is provided on the substrate 15 at the corresponding position. Further, a frame 31 including the opening portion 31a is mounted at the corresponding position on an end portion of the imaging device 16. Still further, the lens barrel portion 11 including the optical system block 12 is mounted on the frame 31 and bonded with the adhesive 14.

According to the configuration as illustrated in FIG. 3, by incident light incident from above in the drawing being transmissive through the optical system block 12, the incident light is adjusted to be focused on the imaging device 16, transmissive through the glass plate 13, and incident on the imaging device 16. The imaging device 16 outputs an image signal formed with a pixel signal generated through photoelectric conversion by the incident light incident in this manner.

<Manufacturing Processing of Imaging Apparatus in FIG. 3>

Figure 4:
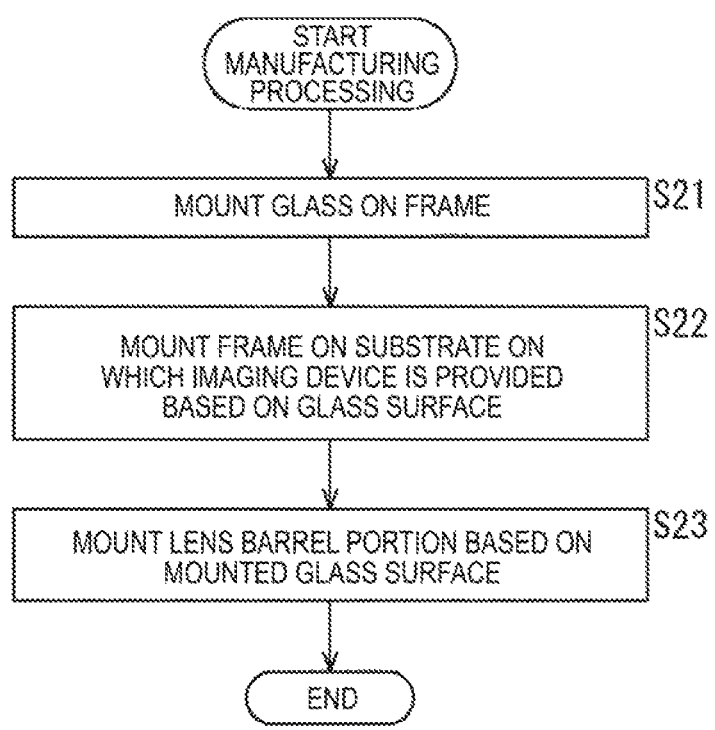
FIG. 4 is a flowchart explaining manufacturing processing of an imaging device in FIG. 3.

Manufacturing processing of the imaging apparatus in FIG. 3 will be described next with reference to the flowchart in FIG. 4.

In step S21, the glass plate 13 is mounted at a position corresponding to the opening portion 31a on the frame 31.

In step S22, the frame 31 on which the glass plate 13 is mounted is mounted on the imaging device 16 mounted on the substrate 15 so that a distance with the imaging device 16 based on the surface of the glass plate 13 (or a predetermined reference plane) becomes an optically appropriate distance in terms of design.

In step S23, the lens barrel portion 11 is mounted so that the optical system block 12 is set at a position with an optically appropriate distance in terms of design based on the surface of the glass plate 13 (or a predetermined reference plane) on the glass plate 1, and fixed with the adhesive 14.

Through the above processing, even when the lens barrel portion 11 is provided on the frame 31, because the optical system block 12 and the imaging device 16 can be provided at positions with optically appropriate distance in terms of design from the surface of the glass plate 13 (or the predetermined reference plane), it is possible to obtain high optical characteristics.

Further, because the optical system block 12 and the imaging device 16 are assembled based on a distance from the surface of the glass plate 13 or the predetermined reference plane, it is possible to make the substrate 15 thinner, which results in making it possible to make the whole imaging apparatus thinner and to save a material of the substrate 15.

Further, because the lens barrel portion 11 and the imaging device 16 are assembled while it is confirmed that the distance is optically appropriate based on the surface of the glass plate 13 (or other predetermined reference plane), it is possible to omit subsequent optical confirmation, or the like, which makes it possible to omit workload in the manufacturing process.

It should be noted that the lens barrel portion 11 including the optical system block 12 and the imaging device 16 provide the same advantageous effects regardless of other configurations as long as the lens barrel portion 11 and the imaging device 16 are provided according to a distance from the surface of the glass plate 13 (or the predetermined reference plane).

The present technology is not limited to the above-described embodiments, but various modifications are possible insofar as they are within the scope of the present technology.

Additionally, the present technology may also be configured as below.

(1) An imaging apparatus including:
an optical system block configured to focus incident light at a predetermined focus point;
a glass plate configured to transmit incident light incident through the optical system block; and
an imaging device configured to generate a pixel signal through photoelectric conversion with the incident light focused by the optical system block through the glass plate,
wherein the optical system block and the imaging device are assembled at positions based on a predetermined position of the glass plate.

(2) The imaging apparatus according to (1),
wherein the predetermined position is a position on a surface of the glass plate.

(3) The imaging apparatus according to (1),
wherein the optical system block is assembled on the glass plate.

(4) The imaging apparatus according to (1), further including:
a frame on which the glass plate is mounted on a substrate on which the imaging device is assembled,
wherein the imaging device is assembled at the position based on the surface position of the glass plate in a state where the imaging device is assembled on the substrate.

(5) Electronic equipment in an imaging apparatus including:
an optical system block configured to focus incident light at a predetermined focus point;
a glass plate configured to transmit incident light incident through the optical system block; and
an imaging device configured to generate a pixel signal through photoelectric conversion with the incident light focused by the optical system block through the glass plate,
wherein the optical system block and the imaging device are assembled at positions based on a predetermined position of the glass plate.

(6) A manufacturing method of an imaging apparatus including
an optical system block configured to focus incident light at a predetermined focus point,
a glass plate configured to transmit incident light incident through the optical system block, and
an imaging device configured to generate a pixel signal through photoelectric conversion with the incident light focused by the optical system block through the glass plate, the manufacturing method including:
a first step of assembling the glass plate;
a second step of assembling the imaging device at a position based on a predetermined position of the glass plate; and
a third step of assembling an optical system block at a position based on the predetermined position of the glass plate.

(7) The manufacturing method of the imaging apparatus according to (6),
wherein the predetermined position is a position on a surface of the glass plate.

(8) The manufacturing method of the imaging apparatus according to (6),
wherein, in the third step, the optical system block is assembled at the position based on the predetermined position of the glass plate on the glass plate.

(9) The manufacturing method of the imaging apparatus according to (6),
wherein the imaging apparatus further includes a frame on which the glass plate is mounted on a substrate on which the imaging device is assembled, and
in the second step, the imaging device is assembled at the position based on the predetermined position of the glass plate in a state where the imaging device is assembled on the substrate.

(10) A manufacturing method of electronic equipment including
an optical system block configured to focus incident light at a predetermined focus point,
a glass plate configured to transmit incident light incident through the optical system block, and
an imaging device configured to generate a pixel signal through photoelectric conversion with the incident light focused by the optical system block through the glass plate,
the manufacturing method including:
a first step of assembling the glass plate;
a second step of assembling the imaging device at a position based on a predetermined position of the glass plate; and
a third step of assembling an optical system block at a position based on the predetermined position of the glass plate.

REFERENCE SIGNS LIST 11 lens barrel portion
12 optical system block
13 glass plate
14 adhesive
15 substrate
15a opening portion
16 imaging device
17 chip wiring
31 frame
31a opening portion

The invention claimed is:
1. An imaging apparatus, comprising:
an optical system block configured to focus incident light at a focus point;
a glass plate configured to transmit the incident light incident via the optical system block;
an imaging device configured to generate a pixel signal; and
a substrate between the optical system block and the imaging device,
wherein the substrate has a first surface on which the glass plate is mounted, and a second surface that is in contact with the imaging device,
wherein the second surface is opposite to the first surface,
wherein the substrate has an opening, and
wherein the pixel signal is generated based on photoelectric conversion with the incident light focused by the optical system block through the glass plate and the opening of the substrate.

2. The imaging apparatus according to claim 1, wherein arrangement of the optical system block and the imaging device is based on a particular position on a surface of the glass plate.

3. The imaging apparatus according to claim 1, wherein the optical system block is on the glass plate.

4. The imaging apparatus according to claim 1, further comprising a frame on which the glass plate is mounted.

5. An electronic equipment, comprising:
an optical system block configured to focus incident light at a focus point;
a glass plate configured to transmit the incident light incident via the optical system block;
an imaging device configured to generate a pixel signal; and
a substrate between the optical system block and the imaging device,
wherein the substrate has a first surface on which the glass plate is mounted, and a second surface that is in contact with the imaging device,
wherein the second surface is opposite to the first surface,
wherein the substrate has an opening, and
wherein the pixel signal is generated based on photoelectric conversion with the incident light focused by the optical system block through the glass plate and the opening of the substrate.

6. A method of manufacturing an imaging apparatus, the method including:
assembling a glass plate configured to transmit incident light incident via an optical system block;
assembling an imaging device, configured to generate a pixel signal, at a first position based on a particular position of the glass plate; and
assembling the optical system block at a second position based on the particular position of the glass plate,
wherein a substrate is between the optical system block and the imaging device,
wherein the substrate has a first surface on which the glass plate is mounted, and a second surface that is in contact with the imaging device,
wherein the second surface is opposite to the first surface,
wherein the substrate has an opening, and
wherein the pixel signal is generated based on photoelectric conversion with the incident light focused by the optical system block through the glass plate and the opening of the substrate.

7. The method according to claim 6,
wherein the particular position of the glass plate is a position on a surface of the glass plate.

8. The method according to claim 6,
wherein the optical system block is on the glass plate.

9. The method according to claim 6, including mounting the glass plate on a frame, wherein the frame is included in the imaging apparatus.

10. A method of manufacturing an electronic equipment, the method comprising:
 assembling a glass plate configured to transmit incident light incident via an optical system block;
 assembling an imaging device, configured to generate a pixel signal, at a first position based on a particular position of the glass plate; and
 assembling the optical system block at a second position based on the particular position of the glass plate,
 wherein a substrate is between the optical system block and the imaging device,
  wherein the substrate has a first surface on which the glass plate is mounted, and a second surface that is in contact with the imaging device,
  wherein the second surface is opposite to the first surface,
  wherein the substrate has an opening, and
  wherein the pixel signal is generated based on photoelectric conversion with the incident light focused by the optical system block through the glass plate and the opening of the substrate.

\* \* \* \* \*